(12) United States Patent
Bunyan et al.

(10) Patent No.: US 8,766,108 B2
(45) Date of Patent: Jul. 1, 2014

(54) ENCAPSULATED EXPANDED CRIMPED METAL MESH FOR SEALING AND EMI SHIELDING APPLICATIONS

(75) Inventors: Michael H. Bunyan, Chelmsford, MA (US); George R. Watchko, Stoneham, MA (US); William G. Lionetta, Harwich Port, MA (US)

(73) Assignee: Parker Hannifin Corporation, Cleveland, OH (US)

( * ) Notice: Subject to any disclaimer, the term of this patent is extended or adjusted under 35 U.S.C. 154(b) by 23 days.

(21) Appl. No.: 13/103,192

(22) Filed: May 9, 2011

(65) Prior Publication Data

US 2012/0048612 A1 Mar. 1, 2012

Related U.S. Application Data

(63) Continuation of application No. PCT/US2010/055037, filed on Nov. 2, 2010.

(60) Provisional application No. 61/378,148, filed on Aug. 30, 2010.

(51) Int. Cl.
*H05K 9/00* (2006.01)
*H01R 43/00* (2006.01)

(52) U.S. Cl.
USPC .............................. 174/355; 174/358; 29/825

(58) Field of Classification Search
USPC ..................................... 174/355, 358; 29/825
See application file for complete search history.

(56) References Cited

U.S. PATENT DOCUMENTS

| | | | |
|---|---|---|---|
| 2,477,267 A | | 7/1949 | Robinson |
| 3,126,440 A | * | 3/1964 | Goodloe .................. 174/358 |
| 3,206,536 A | * | 9/1965 | Goodloe .................. 174/357 |
| 3,230,290 A | | 1/1966 | Nelson et al. |
| 4,381,979 A | | 5/1983 | De Nora et al. |
| 4,533,685 A | * | 8/1985 | Hudgin et al. ............. 523/457 |
| 4,678,699 A | * | 7/1987 | Kritchevsky et al. ........ 428/175 |
| 4,865,905 A | | 9/1989 | Uken |
| 4,900,877 A | * | 2/1990 | Dubrow et al. ............. 174/358 |
| 5,250,342 A | * | 10/1993 | Lang et al. ................ 428/138 |
| 5,791,654 A | | 8/1998 | Gaines et al. |
| 5,929,138 A | | 7/1999 | Mercer et al. |
| 6,357,764 B1 | | 3/2002 | Gaines et al. |
| 6,454,267 B1 | * | 9/2002 | Gaines et al. ............. 277/312 |

(Continued)

OTHER PUBLICATIONS

International Search Report of PCT/US2011/49312 dated Dec. 29, 2011.

(Continued)

*Primary Examiner* — Timothy Thompson
*Assistant Examiner* — Rhadames J Alonzo Miller
(74) *Attorney, Agent, or Firm* — Novak Druce Connolly Bove + Quigg LLP; William G. Gosz (57) ABSTRACT

A composite gasket for sealing and EMI shielding is provided. The gasket has a resilient conductive mesh sheet embedded with an elastomer gel layer. The conductive mesh is corrugated to provide a series of repeating waveforms, providing the gasket with a lower deflection force, better corrosion resistance, and a higher EMI shielding capability. A second elastomer can be used around the edge portions of the gasket for improved abrasion resistance and increased tensile strength. A fiberglass sheet can be incorporated in the mesh for added reinforcement and support. The gaskets of the invention can be used on external aircraft components, such as external aircraft antenna mounts.

25 Claims, 8 Drawing Sheets

(56) References Cited

U.S. PATENT DOCUMENTS

| | | |
|---|---|---|
| 6,454,276 B2 * | 9/2002 | Gaines et al. ............... 277/650 |
| 6,530,577 B1 | 3/2003 | Busby et al. |
| 6,695,320 B2 * | 2/2004 | Busby et al. ............... 277/651 |
| 6,719,293 B1 | 4/2004 | Coles et al. |
| 6,784,363 B2 * | 8/2004 | Jones ............... 174/351 |
| 2003/0047718 A1 | 3/2003 | Narayan et al. |
| 2003/0173100 A1 | 9/2003 | Flaherty et al. |
| 2004/0209064 A1 * | 10/2004 | Kaplo ............... 428/306.6 |
| 2009/0086459 A1 * | 4/2009 | Bicket et al. ............... 361/809 |
| 2009/0295103 A1 * | 12/2009 | Ebina et al. ............... 277/650 |
| 2010/0116543 A1 | 5/2010 | Ikeda et al. |

OTHER PUBLICATIONS

International Search Report of corresponding application, International Application No. PCT/US10/55037, dated Dec. 29, 2010.

* cited by examiner

ENCAPSULATED EXPANDED CRIMPED METAL MESH FOR SEALING AND EMI SHIELDING APPLICATIONS

CROSS-REFERENCE TO RELATED APPLICATIONS

This application claims the benefit of priority of U.S. Provisional Application No. 61/378,148, filed on Aug. 30, 2010, and International Application No. PCT/US2010/055037, filed Nov. 2, 2010, the disclosures of which are incorporated herein by reference thereto in their entirety.

BACKGROUND OF THE INVENTION

The present invention relates to gaskets for use in sealing and EMI shielding applications, and particularly for aircraft related applications. More particularly, the present invention relates to a resilient crimped electrically-conductive mesh sheet encapsulated with a polymeric elastomer gel polymer for use in shielding and protecting external aircraft components which generate or receive electromagnetic radiation.

In general, electronic components are sources of electromagnetic (EM) radiation. Electronic components, for example, transmitters, transceivers, microcontrollers, microprocessors and the like radiate a portion of the electric signals propagating through a device as EM radiation. The EM radiation generated in this way is sometimes referred to as EM noise. Higher operating frequency ranges of the electronic components leads to the EM noise that primarily comprise radio frequency (RF) radiation. This RF radiation is normally referred to as RF noise. As may be used herein, EM noise and RF noise are used merely to refer to EM radiations emitted from an electronic device. Moreover, EM noise and RF noise, unless otherwise stated, may be used interchangeably throughout the specification. EM radiation may also be emitted from electronic devices in close proximity to each other (EMI, or electromagnetic interference).

Electronic devices have been conventionally shielded to impede the emission of EM noise. Specifically, the electronic devices can be enclosed in a shield. The shield may be made of various materials, for example, metal sheets, plastic composites, conductive polymer sprays, metal filled epoxy pastes and the like. The shield absorbs EM radiation thereby impeding the emission of EM noise from an assembly of the electronic devices and the shield.

Composite gaskets generally comprising a metal core material enclosed or encapsulated within a resilient polymeric material are well known in the art. Such gaskets have sufficient structural integrity to be useful in sealing components in corrosive and high performance environments, such as for pressure vessels, automotive engines and aircraft. Examples of such gaskets include U.S. Pat. Nos. 3,230,290; 4,865,905; 5,791,654; 5,929,138; 6,357,764; 6,454,267; 6,530,577; 6,695,320; and U.S. Pat. No. 6,719,293. Composite gaskets may also include EMI shielding capabilities, such as those disclosed in U.S. Pat. Nos. 2,477,267; 3,126,440; and U.S. Pat. No. 4,900,877. The disclosure of each of these patents is incorporated by reference herein in their entirety.

Many of the gaskets described in the aforementioned patents may not be acceptable for high performance applications, typically aircraft applications, where a variety of performance characteristics may be required in harsh working environments. For example, in addition to EMI shielding and sealing, electrical bonding of components and protection against corrosion may be a necessity.

Conventional gaskets typically have electrical contact only at the edge portion of the gasket. Most such gaskets involve a woven flat wire mesh buried within the body of the elastomer not near the surface. When the gasket is cut to size, the wire mesh is exposed at the edge of the gasket and bent up near the surface. Since the electrical contact of these gaskets and the sealed components is at the edge portion of the gasket, a caulk must be applied at the edge of the gasket to protect the wire mesh from corrosion while maintaining the electrical bonding and EMI shielding. The application and curing of the caulk requires several hours of application and curing time, increasing down time of the aircraft, for instance. When a gasket is replaced, the old caulk must first be removed, and the removal procedure can result in scratches to the protective coating of the aircraft, requiring a repainting of the aircraft surface, thereby expanding the scope and duration of the repair. In addition, most caulking compounds have a limited shelf life which can create inventory obsolescence and increase associated costs.

It would also be advantageous to have a commercial product with a greater deflection range, requiring the application of less closure force, fewer attachment bolts, and thinner mating flanges. Thinner flanges and fewer bolts lead to reduced weight which is important for aircraft applications. Additionally, a gasket with a greater deflection range would be able to provide environmental sealing between mating surfaces which may have a substantial lack of conformity for protection against environmental leakage.

Accordingly, there is a perceived need for an improved composite gasket design, particularly in aircraft applications, that would provide for improved sealing and EMI shielding, while necessitating fewer overall repair and maintenance problems.

SUMMARY OF THE INVENTION

The present invention, in one embodiment, is directed to composite EMI shielding gaskets adapted for placement between and compressed by adjacent interface surfaces, to provide sealing and electrical conductivity between said surfaces. Advantageously, such surfaces can form part of an external aircraft fuselage, such as an external avionics package.

The composite gasket comprises a resilient, electrically conductive mesh sheet which is embedded in or encapsulated by a polymer gel layer. The mesh sheet is a three dimensional structure, generally planar in shape with a thickness generally smaller than the length and width of the sheet. Prior to encapsulation by the polymer gel, the mesh is corrugated to form a series of waveforms having amplitudes extending in the direction of the thickness of the sheet (z-axis). Preferably, the mesh sheet is corrugated by a process of crimping the mesh using a suitable device, such as, for instance, passing the mesh sheet through a pair of adjacent rollers having ribbed surfaces configured for this purpose. The mesh sheet can be advantageously positioned close to both outer surfaces of the encapsulating polymer gel layer.

In one aspect, the outer perimeter of the gel layer extends beyond the mesh outer margin to define an edge portion of the gasket. The edge portion of the gasket can also extend beyond either or both of the interface surfaces. The edge portion of the gasket can be formed from an elastomeric gel which is a different gel polymer from the portion of the gel which encapsulates the mesh sheet. Preferably, the elastomeric gel forming the edge portion of the gasket has a durometer measurement higher than the durometer measurement for the gel forming the remaining portion of the gasket. In some applications, the edge portion of the gasket can be tapered in an outwardly extended direction, and the compressible surfaces of the gel contacting the interface surface to be sealed have a tacky surface quality.

The mesh sheet can be advantageously formed from conductive metal wires or fibers. Suitable metals include, for example, copper, nickel, silver, aluminum, bronze, steel, tin, or an alloy or combination thereof. The metal fibers can also be coated with one or more of the foregoing metals.

Alternatively, the mesh sheet can be formed from non-conductive fibers having an electrically conductive coating. Suitable non-conductive fibers include cotton, wool, silk, cellulose, polyester, polyamide, nylon, polyimide and combinations thereof. Suitable conductive coatings include copper, nickel, silver, aluminum, tin, carbon, graphite, or an alloy or combination thereof. Additional materials for fabricating the mesh include carbon fibers, graphite fibers and inherently conductive polymer fibers.

In another aspect, a fiberglass scrim can be molded in with the corrugated metal mesh prior to encapsulation with the polymer gel layer. During the molding process, the fiberglass sheet is melted and integrated into the metal mesh forming a composite structure. The fiberglass scrim acts like a reinforcement material to prevent distortion and elongation of the crimped metal mesh. In this manner, the composite gasket can be formed into sheets, cut to size for the particular application, and repositioned between adjacent aircraft surfaces without distorting the gasket.

In another embodiment, the invention is directed to an EMI shielded assembly comprising a first interface surface, a second interface surface, and an EMI shielding gasket compressed between the first and second interface surfaces and providing electrical conductivity between the surfaces. The EMI shielding gasket is as described above.

In yet another embodiment, the invention is directed to a method for providing EMI shielding to an assembly by interposing the composite gasket as described above between a first interface surface and a second interface surface, and compressing the gasket between said surfaces to establish sealing and electrical conductivity between the first interface surface and the second interface surface. In one aspect, the first and second interface surfaces can be part of an external aircraft assembly, such as an aircraft antenna mounted to the aircraft fuselage.

In a further embodiment, the invention is directed to a method of making an EMI shielding gasket adapted to be compressed between a first interface surface and a second interface surface by providing a resilient, electrically-conductive mesh sheet, corrugating the mesh sheet to form a series on waveforms in the sheet having amplitudes extending in the direction of the thickness of the sheet (z-axis), and embedding the corrugated mesh sheet within the polymer gel layer, wherein when the gasket is compressed between the first and second interface surfaces, the mesh sheet provides electrical conductivity between the first and second interface surfaces.

The present invention, accordingly, comprises the construction, combination of elements and components, and/or the arrangement of parts and steps which are exemplified in the following detailed disclosure. The foregoing aspect and embodiments of the invention are intended to be illustrative only, and are not meant to restrict the spirit and scope of the claimed invention.

BRIEF DESCRIPTION OF THE DRAWINGS

The foregoing and other advantages and features of the invention will become apparent upon reading the following detailed description with reference to the accompanying drawings in which:

FIG. 6 depicts various details of a gasket used for providing sealing and EMI shielding for an antenna externally mounted on an aircraft fuselage.

FIG. 7 is a side view of the corrugated metal mesh sheet and a fiberglass (scrim) sheet.

DETAILED DESCRIPTION OF THE INVENTION

The composite gasket of the present invention is intended for insertion and compression between adjacent surfaces where both sealing and EMI shielding may be required. The gasket includes a resilient, electrically conductive mesh sheet embedded within a polymer gel layer. The mesh sheet can be, for example, an expanded metal mesh or a metal wire screen or a metal-plated fabric sheet. Typically, the mesh sheet may be formed from metal or metal alloy wires or fibers, graphite or carbon fibers, or metallized or metal-coated or metal plated non-conductive woven or non-woven fabric, such as nylon fabric or nylon fibers. In general, the surface resistivity of the mesh sheet is less than about 0.1 Ω/sq. As used herein, the term "mesh" includes fabrics, cloths, webs, mats, screens, meshes and the like, which may be open, such as in the case of a screen, or closed, such as in the case of a fabric.

The mesh can be inherently conductive if formed from a metal or metal alloy, graphite, carbon, etc., as wires, monofilaments, yarns, bundles, or other fibers or materials which are inherently conductive. Alternatively, the mesh can be non-conductive and rendered electrically-conductive by means of an applied coating, plating, sputtering, or other treatment of the electrically conductive material. Representative of the inherently electrically conductive materials include metals, such as copper, nickel, silver, aluminum, steel, tin and bronze, alloys thereof, such as Monel nickel-copper alloys, non-metals, such as carbon, graphite, and inherently conductive polymers, and plated or clad wires or other fibers such as one or more of copper, nickel, silver, aluminum, steel, tin, bronze, or an alloy thereof, e.g. silver-plated copper, nickel-clad copper, Ferrex® (Parker Chomerics, Woburn, Mass.), tin-plated copper-clad steel, tin-clad copper, and tin-plated phosphor bronze. Representative non-conductive fibers include cotton, wool, silk, cellulose, polyester, polyamide, nylon, and polyimide monofilaments or yarns which are plated, clad or otherwise coated with an electrically-conductive material which may be a metal mesh such as copper, nickel, silver, aluminum, tin, or an alloy or combination thereof, or a non-metal such as carbon, graphite, or a conductive polymer. The plating, cladding or other coating may be applied to individual fiber strands or to the surface of the fabric after weaving, knitting or other fabrication. Combinations of one or more of the foregoing conductive fibers and/or one or more of the foregoing coated non-conductive fibers may also be employed.

As indicated previously, the mesh sheet is corrugated to provide a series of waveforms in the mesh sheet by, for instance, the use of a crimping process. The crimping process is designed to create a planar wave in the mesh sheet to allow for deflection in the thickness direction (z-axis) to provide for low closure force. Typically, the mesh sheet is an expanded metal mesh, a metal wire screen, or a metal-plated fabric sheet.

Figure 1A:
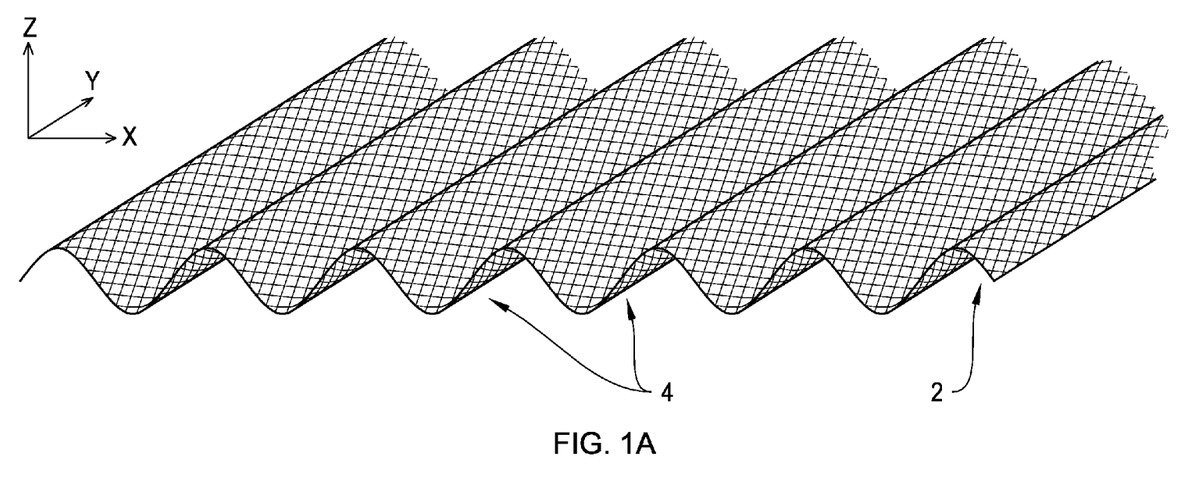
FIG. 1A is a perspective view of the resilient, electrically conductive metal mesh of the present invention corrugated to form a series of waveforms having amplitudes extending in the z-direction (thickness) prior to encapsulation with a polymer gel layer. A preferred embodiment of the mesh is shown in FIG. 1B depicting variations in the mesh peaks (higher and flat mesh peaks) for enhanced electrical contact with a substrate.
Figure 1B:
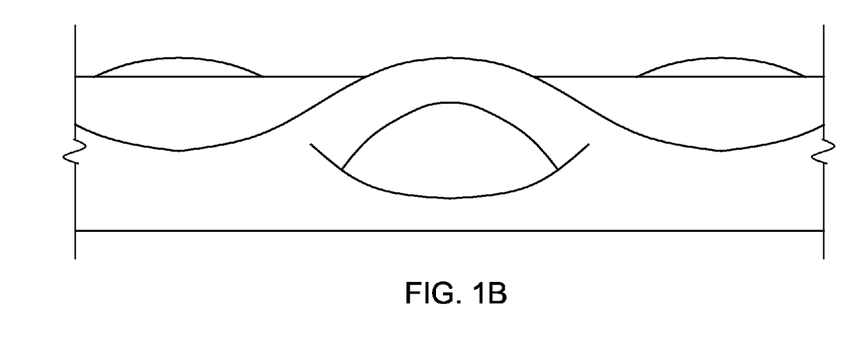

FIG. 1A illustrates a typical mesh sheet 2 having a lengthwise dimension along the x-axis and a widthwise dimension along the y-axis as shown. A series of waveforms 4 are shown formed in the mesh sheet having amplitudes extending in the direction of the thickness dimension along the z-axis as shown. The contact points between the mesh and the metallic interface surfaces are the peak portions of the mesh. These peak portions can be extended outwardly along the z-axis and flattened at the top portion of the peak to facilitate electrical contact as shown in FIG. 1B. FIG. 1B is an exploded view of the top portion of the peak representing this particular aspect of the invention. It will be readily appreciated that other designs in the peak portions of the mesh may also be used to facilitate such electrical contact.

Figure 2:
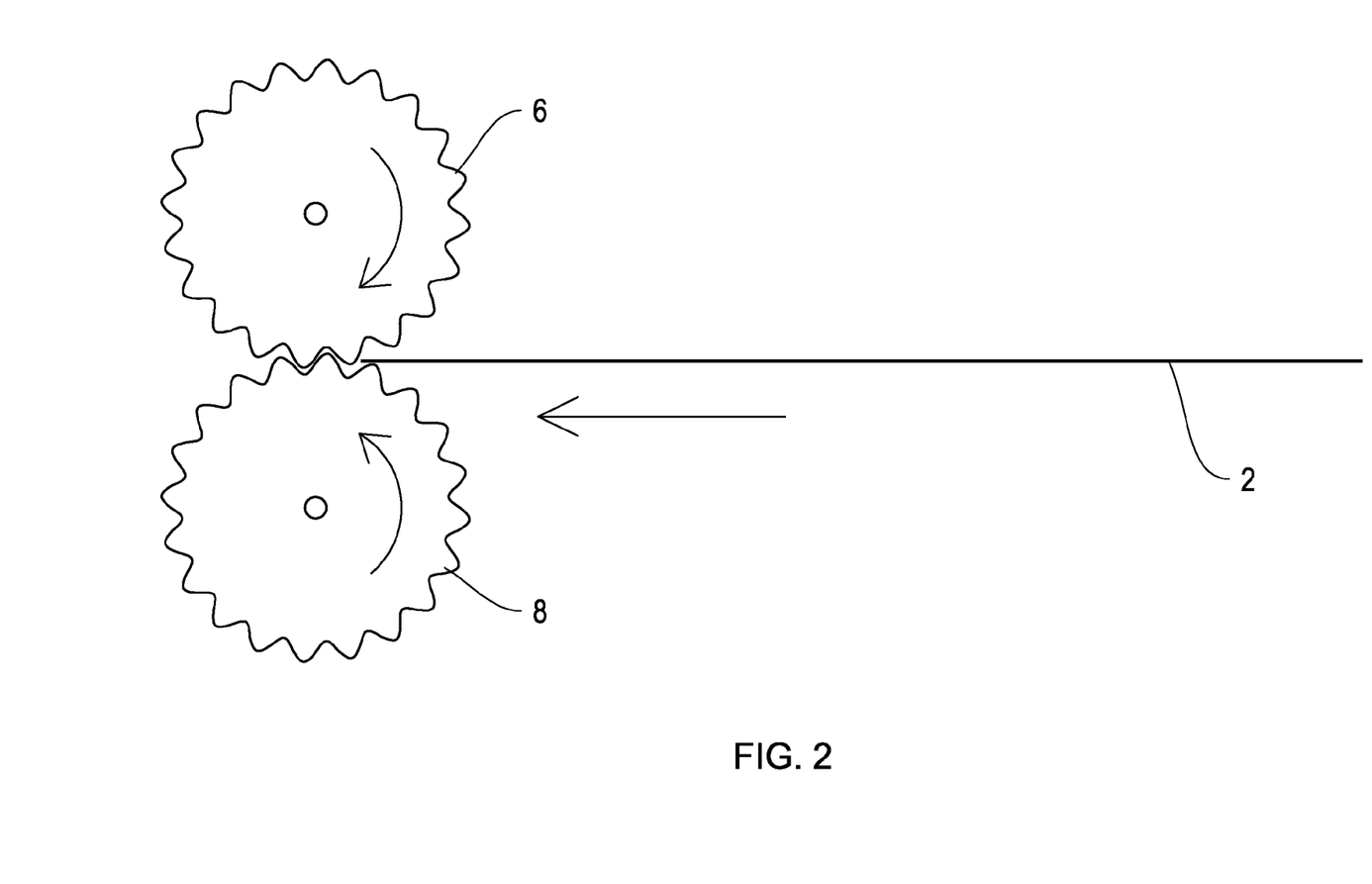
FIG. 2 illustrates a device which can be used for crimping a mesh sheet to form a corrugated configuration having a series of waveforms with amplitudes in the thickness direction.

FIG. 2 illustrates a crimping method for forming the waveform in the flat mesh sheet. As shown, the flat mesh sheet 2 is fed into opposed ribbed rollers 6 and 8. As the mesh sheet passes through the ribs, corrugations are created in the mesh forming a series of waveforms. The size and shape of the waveform and its amplitude can be adjusted by changing the size and shape of the ribs on the rollers. For a typical gasket used in avionics applications, for instance, a 30 mils (0.030 inch) sheet of expanded aluminum mesh can be passed through crimping rolls to form a corrugated sheet with a waveform having an amplitude of about 80 mils (0.080 inches).

The crimping or corrugation allows for a greater deflection range with less closure force, thereby permitting the gasket to be used with fewer bolts and thinner mating flanges. The greater deflection range permits mechanical sealing on surfaces with a large lack of conformity to provide an environmental seal. The use of thinner flanges and fewer bolts reduces the weight of the items being sealed together, such as, e.g. an aircraft antenna. The use of fewer bolts also reduces maintenance time. The overall lower deflection force required for sealing prevent flange bowing upon bolt torquing, thereby providing an improved environmental seal. The environmental seal protects against environmental leakage, provides pressure sealing, and improves corrosion resistance in the flange.

Moreover, crimping allows the mesh to be positioned at the opposing surfaces and to establish electrical contact with opposed interface surfaces at lower deflection forces than conventional gaskets, eliminating the need for the exposed wire mesh at the outer edges of the gasket to achieve electrical contact. Therefore, the wire mesh can be cut smaller than the gasket footprint, permitting the edges to be formed entirely from an elastomer. This prevents corrosion of the wire mesh and eliminates galvanic corrosion with mating flanges.

Figure 3:
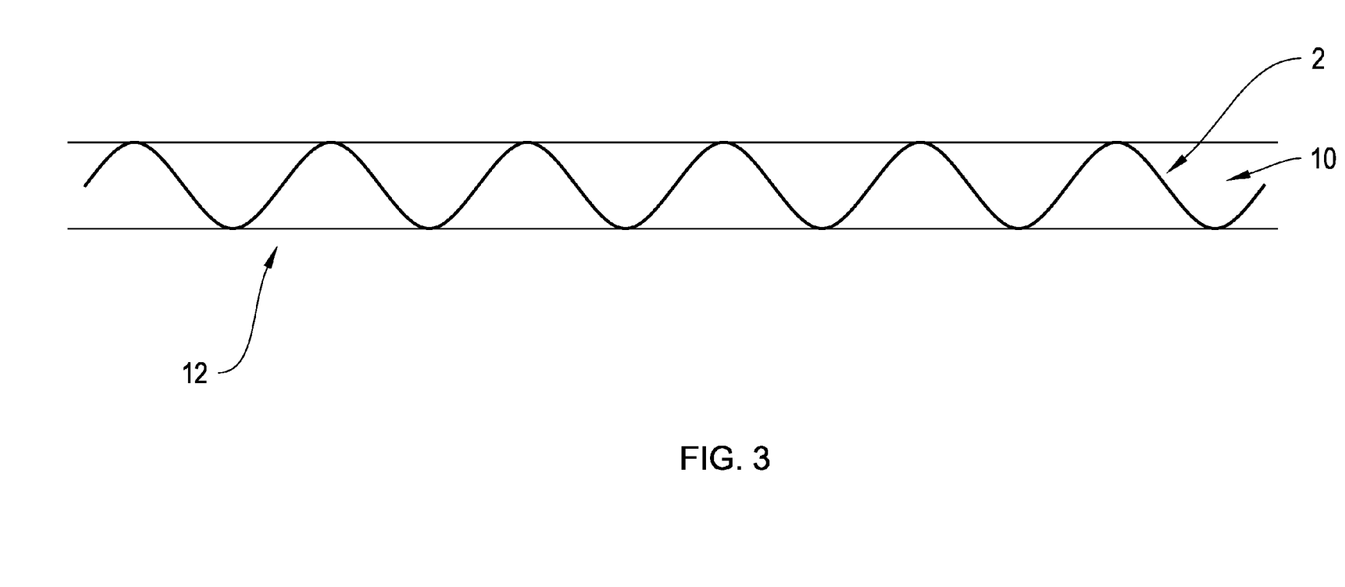
FIG. 3 is a side view of the EMI shielding gasket of the invention showing the corrugated mesh sheet encapsulated with a polymer gel layer.

Following crimping of the mesh sheet, the mesh sheet is encapsulated or embedded in a polymer gel layer to form the gasket. FIG. 3 depicts a gasket 12 of the invention, wherein mesh sheet 2 is encapsulated in polymeric elastomer gel 10. The encapsulation of the mesh sheet can be accomplished using known encapsulation techniques. See, in this regard, U.S. Pat. No. 6,695,320, the disclosure of which is incorporated herein by reference in its entirety. Preferably, the mesh sheet is positioned within the polymeric elastomer gel such that the sheet is close to each of the outer surfaces of the encapsulating gel, while creating a gel only area around any exterior portion of the gasket for protection against corrosion.

Figure 7A:
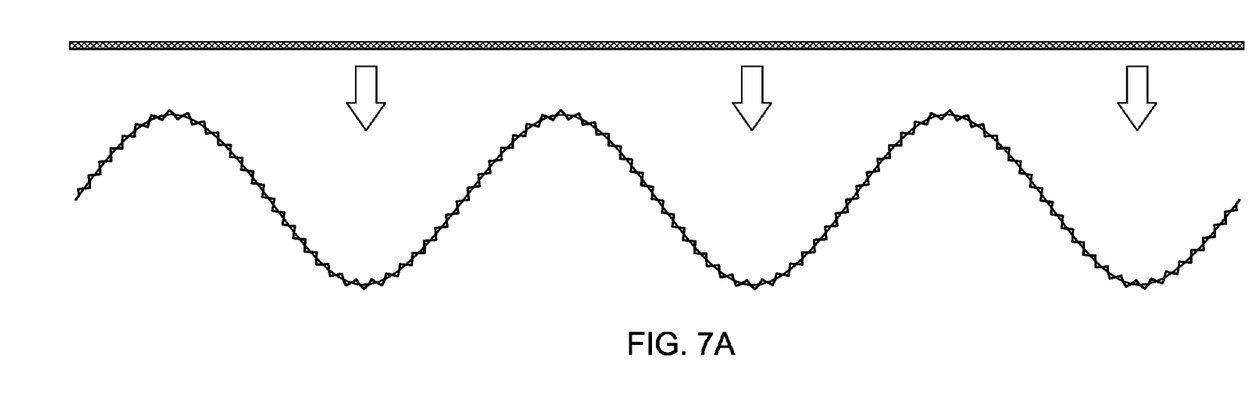
FIG. 7A depicts the two components prior to molding.
Figure 7B:
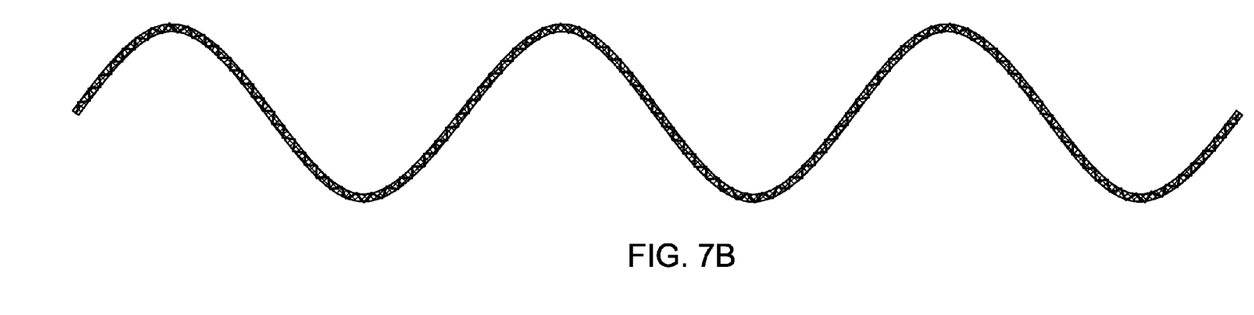
FIG. 7B depicts an integrated composite structure formed after the molding process.

In a preferred embodiment, prior to encapsulation with the polymer gel, a fiberglass scrim sheet can be combined with the metallic corrugated mesh structure in a molding process to form a composite structure. During the molding process, the fiberglass sheet melts and is incorporated into the metal mesh structure. The purpose of the fiberglass scrim sheet is to provide additional reinforcement for the metal mesh. This serves to prevent distortion and elongation of the mesh during processing and final application of the gasket as a seal. This also facilitates the manufacture of larger sheets of the gasket which can be cut to size for particular end use applications. The fiberglass reinforcement additionally provides support for repositioning and removing the gasket without distorting it. FIG. 7 depicts the metal mesh and fiberglass scrim sheet of the invention. As shown in FIG. 7A, scrim sheet 14 can be contacted with corrugated metal mesh 2, and these components can processed in a molding operation to form an integrated reinforced mesh structure as shown in FIG. 7B. During the molding process, the fiberglass melts and fuses with the corrugated metal mesh. The reinforced structure formed thereby can be encapsulated with the polymer gel to form another embodiment of the gasket of the invention.

In some applications, a dual elastomer system can be employed. Following this approach, the elastomer encapsulating the mesh can be a soft, tacky elastomer having nominal mechanical strength, while the elastomer used for the edge portion of the gasket can be a high abrasion resistant high tensile strength elastomer. The high strength elastomer can be used exclusively for the edge portion of the gasket without encapsulating any portion of the mesh (see FIG. 6), or the high strength elastomer may be used for both the edge portion while overlapping with the soft, tacky elastomer encapsulating the mesh. The elastomeric gel may be formed from polymers such as polyethylene, polypropylene, polypropylene-EPDM blends, butadiene, styrene-butadiene, nitrile rubber, chlorosulfonate, neoprene, urethane, or silicone, or a copolymer, blend or combination thereof.

The gaskets of the invention can be used in a variety of applications and under a variety of environmental conditions. One particularly useful application is for avionics, on both military and civilian aircraft, and particularly for external aircraft seals used to bond exterior electrical and electronic components, such as antennas, lights and altimeters, etc., to the aircraft skin, to provide EMI shielding and sealing around such components. Due to the high resistance to corrosion of the gaskets of the invention, the gaskets can be used in applications other than aviation where a harsh operating environment and a flat gasket form fits the mechanical design of the particular application.

FIG. 6 is a drawing of a gel encapsulated crimped expanded metal antenna gasket of the invention. The antenna gasket of FIG. 6 is designed to provide sealing and EMI shielding for an externally mounted aircraft antenna, while maintaining an aerodynamic profile for reduced drag. FIGS. 6A and 6B are plan views of antenna gasket assembly 16. FIG. 6C is a cross-section of the gasket of FIG. 6B as shown. FIG. 6D is an expanded view of the end portion of FIG. 6C.

Figure 6A:
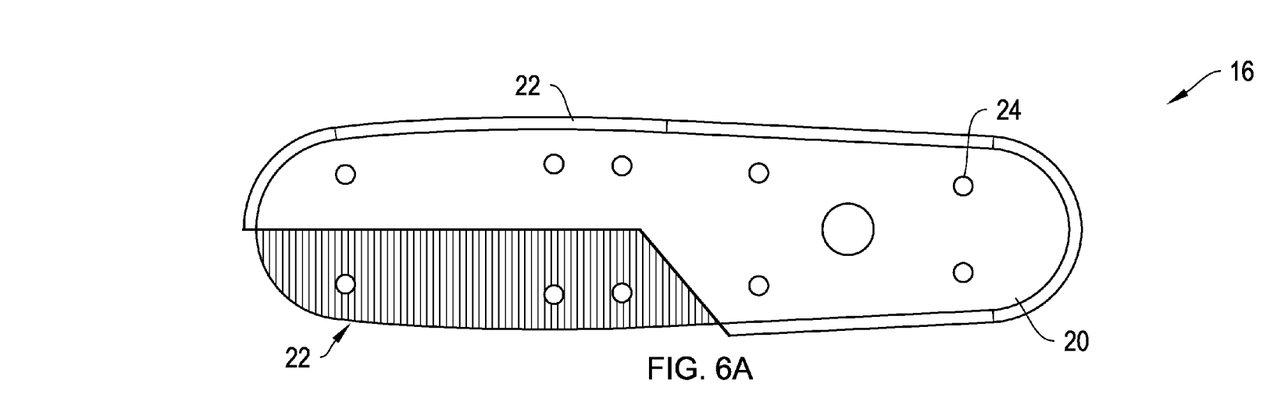
FIG. 6A and FIG. 6B are plan views of the antenna gasket assembly.
Figure 6B:
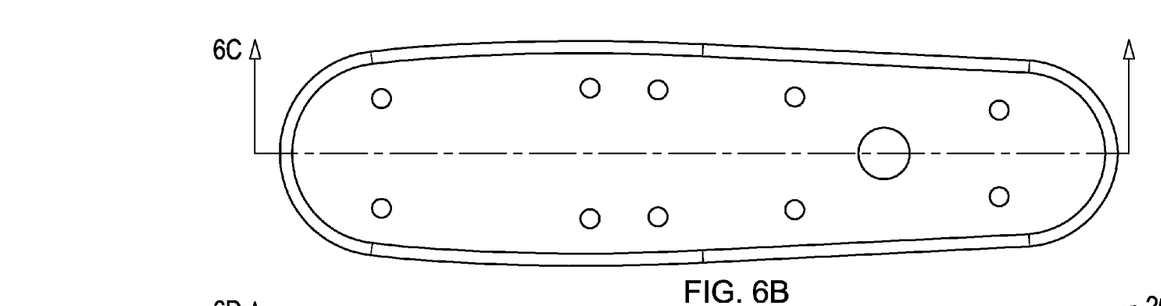
Figure 6C:
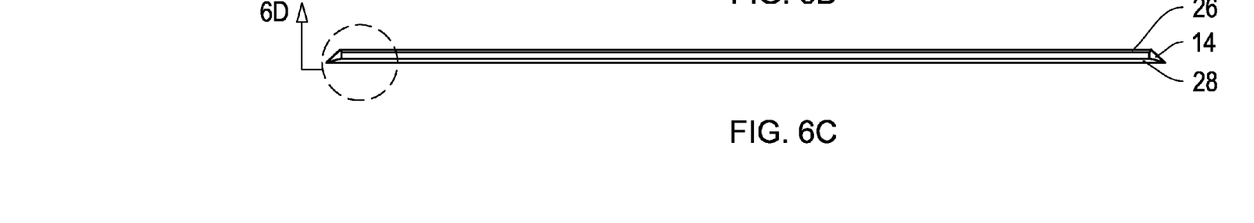
FIG. 6C is a cross-section of the gasket of FIG. 6B.
Figure 6D:
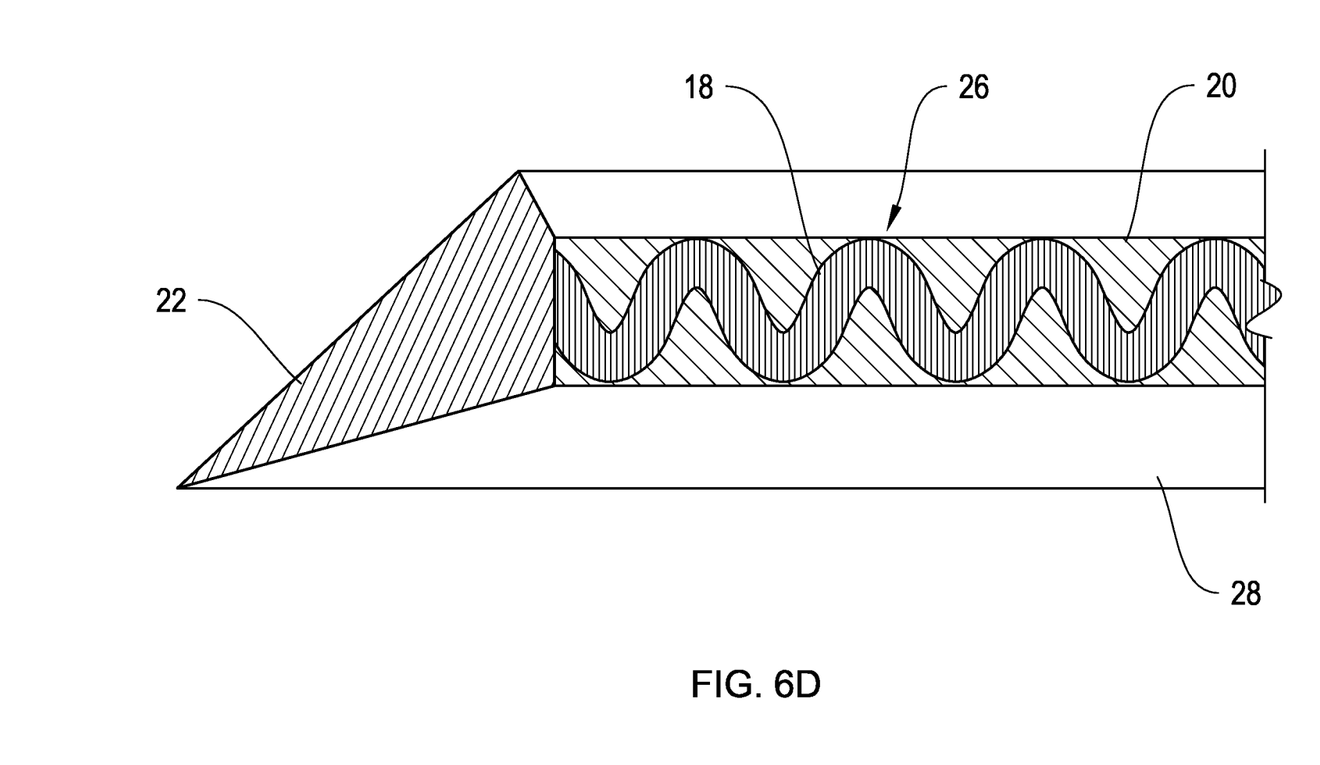
FIG. 6D is an expanded view of the end portion of FIG. 6C.

Gasket assembly 16 includes gasket 14, first interface surface 26 and second interface surface 28. As shown in FIG. 6A and FIG. 6D, antenna gasket 14 includes corrugated aluminum mesh sheet 18 encapsulated with low tensile strength elastomeric gel 20. The edge portion of the gasket is provided with a high tensile strength elastomeric gel 22, and has an aerodynamic edge shape for low drag. Holes 24 are provided in the gasket for mounting to the external aircraft surface (not shown). Gasket 14 is shown compressed between first interface surface 26 and second interface surface 28. Aluminum mesh sheet 18 can advantageously have a thickness of about 0.030 inches, and the waveform formed by the crimping process can advantageously have an amplitude of about 0.080 inches.

The following example is intended to illustrate one aspect of the invention, without limiting it thereby.

EXAMPLES

A series of composite gaskets were prepared or obtained, the gaskets were evaluated, and the performance characteristics of the gaskets were compared. The following composite gaskets were prepared:

Gasket A: 0.036 inch expanded flat aluminum mesh coated with a soft urethane gel polymer.

Gasket B: 0.037 inch expanded flat Monel mesh coated with a soft urethane gel polymer.

Gasket C: 0.036 inch expanded aluminum mesh passed through a crimper to yield a corrugated 0.086 amplitude waveform pattern, coated with the same soft urethane gel as for Gasket A.

Gasket D: 0.037 inch expanded Monel mesh passed through a crimper to yield a corrugated 0.071 amplitude waveform pattern, coated with the same soft urethane gel as for Gasket B.

Gasket E: a commercial 0.062 inch pre-cured polyurethane coated expanded flat aluminum conductive aircraft antenna gasket manufactured by the Av-DEC Corporation.

Figure 4:
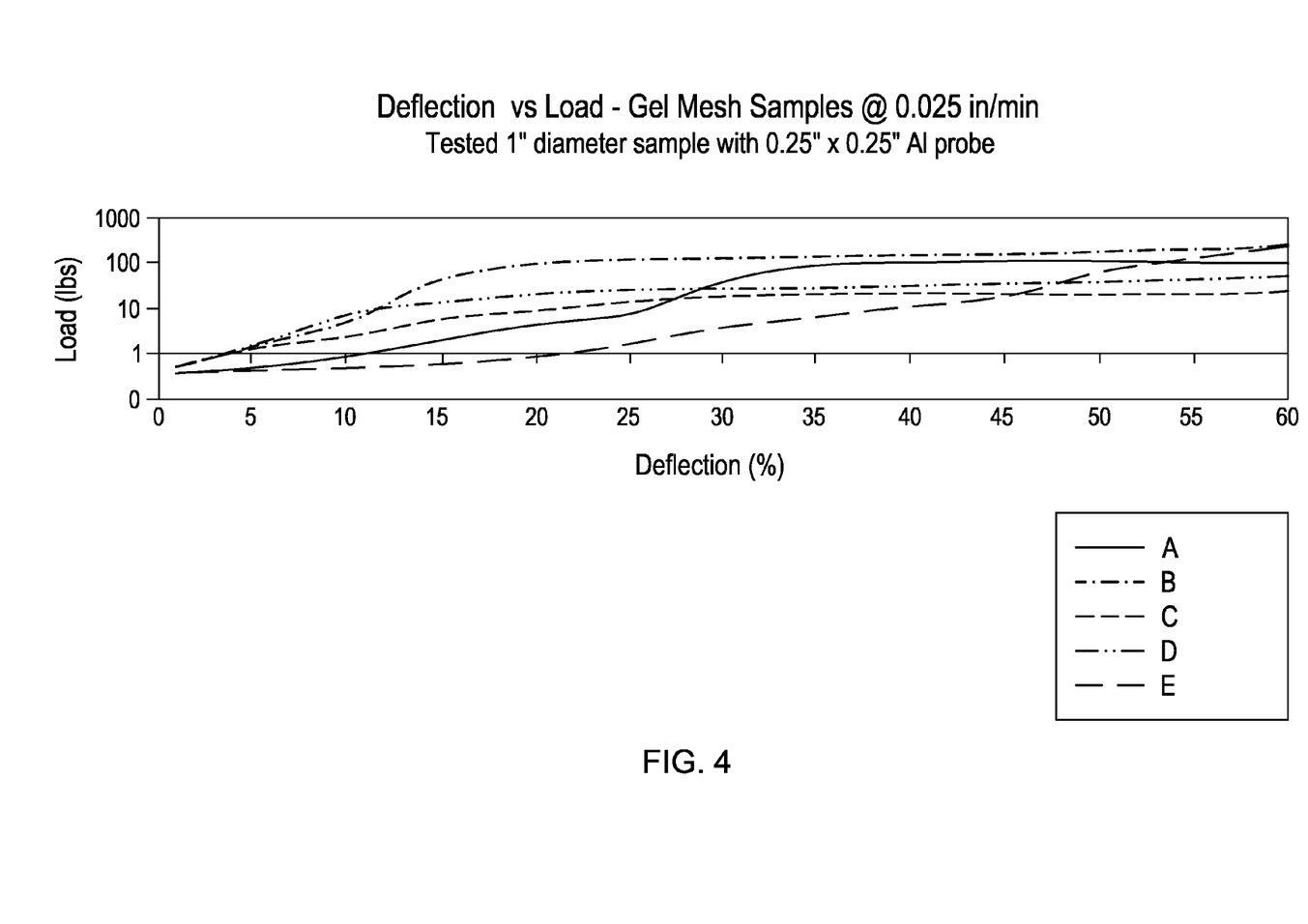
FIG. 4 is graph showing a comparison of the deflection vs. load for various gaskets having a conductive mesh sheet embedded within a polymer gel layer.

Samples (1 inch diameter) of each of the above-identified gaskets were obtained and subjected to varying loads and tested with a 0.25"×0.25" Al probe at 0.025 inches/minute. Each of the above gaskets was subjected to varying load levels (lbs.), and the % deflection was measured and recorded for each sample. The results are shown in FIG. 4. As shown in FIG. 4, Gaskets C and D had maximum % deflection under load.

Figure 5:
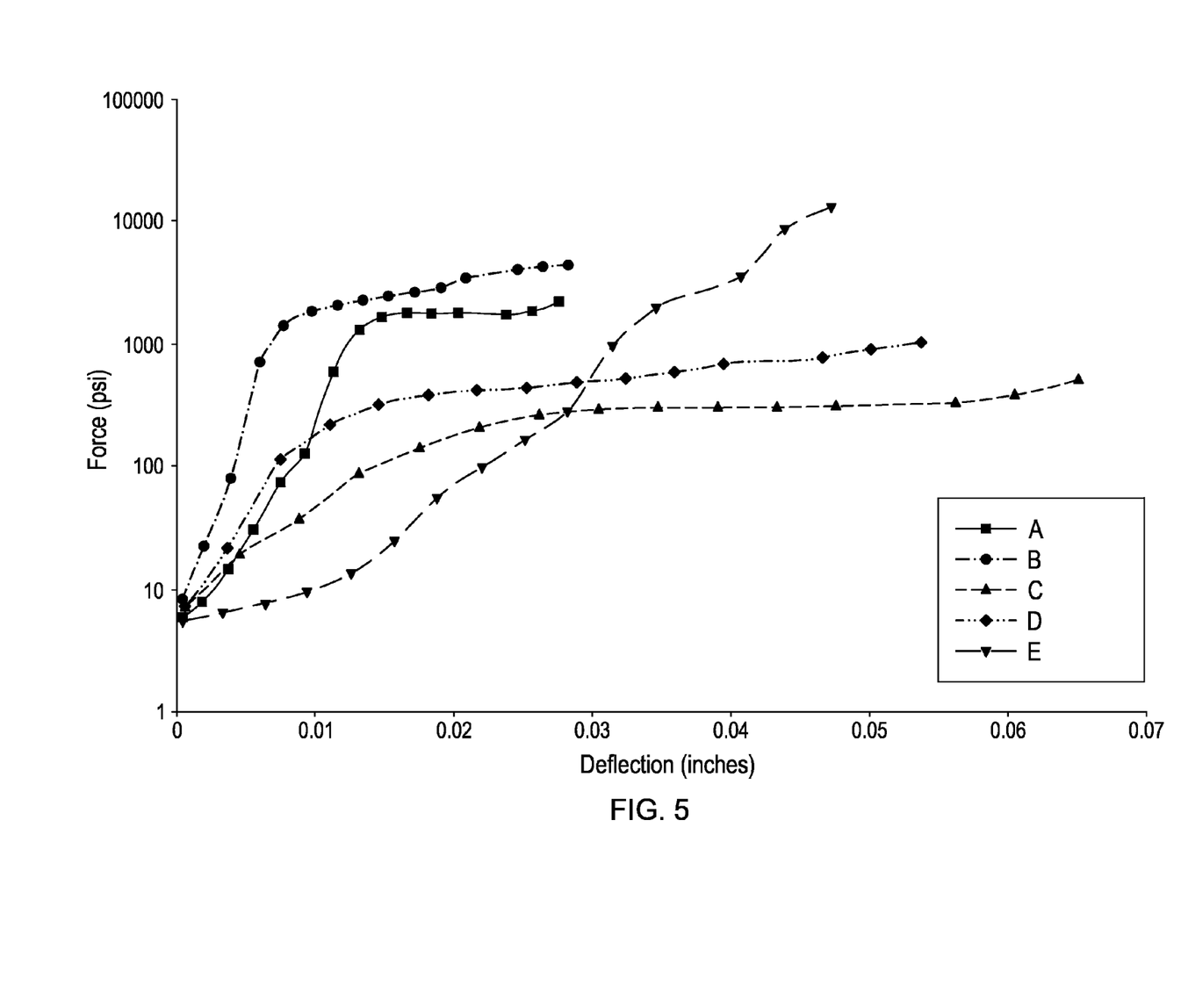
FIG. 5 is another graph depicting the deflection vs. load for various gaskets having a conductive mesh sheet embedded within a polymer gel layer.

Samples of the above-identified gaskets were again evaluated for deflection, and the results above were confirmed. The deflection (in mils) for each of the samples was measured as a function of the applied load (lbs.), and the results for each sample are shown in FIG. 5. As shown in FIG. 5, Gaskets C and D had the maximum deflection under load.

Samples were also evaluated for electrical continuity vs. deflection. The gaskets of the invention were found to have lower deflection than comparative gaskets As it is anticipated that certain changes may be made in the present invention without departing from the precepts herein involved, it is intended that all matter contained in the foregoing description shall be interpreted as illustrative and not in a limiting sense. All references cited herein are expressly incorporated herein by reference thereto in their entirety.

What is claimed is:

1. An EMI shielding gasket for compressible placement between a first aircraft surface and a second aircraft surface for providing improved electrical conductivity and deflection characteristics, the gasket comprising:

a polymer elastomer gel layer, said gel layer having a gel layer outer margin extending along an x-axis and a y-axis, said y-axis disposed generally normal to the x-axis, at least a portion of the gel layer outer margin extending beyond a mesh outer margin, and extending beyond at least one of the first or second aircraft surfaces when the gasket is compressed, to define an edge portion tapered in an outwardly extended direction with a triangular profile at the end thereof, said edge portion having a durometer higher than the durometer of the remainder of the gel; and a resilient, electrically-conductive mesh sheet embedded in the elastomer gel layer, the mesh having the mesh outer margin extending along the x-axis and y-axis, and having a thickness dimension extending along a z-axis, said z-axis disposed generally normal to the x-axis and the y-axis, the mesh sheet being corrugated to form a series of waveforms having amplitudes extending generally along the z-axis;

whereby when the gasket is compressed between the first and the second aircraft surfaces, the mesh sheet provides electrical conductivity across the direction of the x-axis and the y-axis, and electrical contact and improved force deflection between the first and the second aircraft surfaces in the direction of the z-axis.

2. The gasket of claim 1 wherein the mesh is corrugated by crimping the mesh.

3. The gasket of claim 1 wherein the mesh sheet comprises one or more electrically-conductive fibers.

4. The gasket of claim 3 wherein the electrically-conductive fibers are non-conductive fibers having an electrically-conductive coating, metal wires, carbon fibers, graphite fibers, inherently-conductive polymer fibers, or a combination thereof.

5. The gasket of claim 3 wherein: the non-conductive fibers are cotton, wool, silk, cellulose, polyester, polyamide, nylon, polyimide, or a combination thereof, and the electrically-conductive coating is copper, nickel, silver, aluminum, tin, carbon, graphite, or an alloy or combination thereof; and the metal wires are copper, nickel, silver, aluminum, bronze, steel, tin, or an alloy or combination thereof, or one or more of copper, nickel, silver, aluminum, bronze, steel, tin, or an alloy or combination thereof coated with one or more of copper, nickel, silver, aluminum, bronze, steel, tin, or an alloy or combination thereof.

6. The gasket of claim 1 wherein the peak portions of the corrugated mesh sheet are flattened at the top and extended outward along the z-axis.

7. The gasket of claim 1 wherein a fiberglass scrim sheet is molded with the mesh sheet to melt and fuse the fiberglass with the mesh sheet forming an integrated structure prior to embedding the mesh sheet in the elastomer gel.

8. The gasket of claim 1 wherein the x-axis defines a lengthwise dimension of the gasket, the y-axis defines a widthwise dimension of the gasket, and the z-axis defines a thickness dimension of the gasket, the thickness dimension of the gasket being small relative to the lengthwise and the widthwise dimension of the gasket.

9. An EMI shielded assembly comprising: a first aircraft surface; a second aircraft surface; and the EMI shielding gasket of claim 1 compressed between the first and the second aircraft surfaces and providing electrical conductivity therebetween.

10. A method of EMI shielding an assembly including a first aircraft surface and a second aircraft surface, the method comprising the steps of:
  (a) providing an EMI shielding gasket, the gasket comprising: a polymer elastomer gel layer, said gel layer having a gel outer margin extending along an x-axis and a y-axis, said y-axis disposed generally normal to the x-axis, at least a portion of the gel layer outer margin extending beyond the mesh outer margin, and extending beyond at least one of the first or second aircraft surfaces when the gasket is compressed, to define an edge portion tapered in an outwardly extended direction with a triangular profile at the end thereof, said edge portion having a durometer higher than the durometer of the remainder of the gel; and a resilient, electrically-conductive mesh sheet embedded in the elastomer gel layer, the mesh having the mesh outer margin extending along the x-axis and y-axis, and having a thickness dimension extending along a z-axis, said z-axis disposed generally normal to the x-axis and the y-axis, the mesh sheet being corrugated to form a series of waveforms having amplitudes extending generally along the z-axis,
  (b) interposing the gasket between said first aircraft surface and said second aircraft surface; and
  (c) compressing the gasket between the first and said second aircraft surfaces, the mesh sheet providing electrical conductivity across the direction of the x-axis and the y-axis, and electrical contact and improved force deflection between the first and the second aircraft surfaces in the direction of the z-axis.

11. The method of claim 10 wherein the mesh is corrugated by crimping.

12. The method of claim 10 wherein the mesh sheet comprises one or more electrically-conductive fibers.

13. The method of claim 12 wherein the electrically-conductive fibers are non-conductive fibers having an electrically-conductive coating, metal wires, carbon fibers, graphite fibers, inherently-conductive polymer fibers, or a combination thereof.

14. The method of claim 13 wherein: the non-conductive fibers are cotton, wool, silk, cellulose, polyester, polyamide, nylon, polyimide, or a combination thereof, and the electrically-conductive coating is copper, nickel, silver, aluminum, tin, carbon, graphite, or an alloy or combination thereof and the metal wires are copper, nickel, silver, aluminum, bronze, steel, tin, or an alloy or combination thereof, or one or more of copper, nickel, silver, aluminum, bronze, steel, tin, or an alloy or combination thereof coated with one or more of copper, nickel, silver, aluminum, bronze, steel, tin, or an alloy or combination thereof.

15. The method of claim 10 wherein the peak portions of the corrugated mesh sheet are flattened at the top and extended outward along the z-axis.

16. The method of claim 10 wherein a fiberglass scrim sheet is molded with the mesh sheet to melt and fuse the fiberglass with the mesh sheet forming an integrated structure prior to embedding the mesh sheet in the elastomer gel.

17. The method of claim 10 wherein the x-axis defines a lengthwise dimension of the gasket, the y-axis defines a widthwise dimension of the gasket, and the z-axis defines a thickness dimension of the gasket, the thickness dimension of the gasket being small relative to the lengthwise and the widthwise dimension of the gasket.

18. A method of making an EMI shielding gasket compressible between a first aircraft surface and a second aircraft surface, the method comprising the steps of:
  (a) providing a resilient, electrically-conductive mesh sheet selected from the group consisting of expanded metal mesh, metal wire screen, and metal plated fabric;
  (b) corrugating the mesh sheet to form a series of waveforms, the corrugated mesh sheet having a mesh outer margin extending along an x-axis and a y-axis, said y-axis disposed generally normal to the x-axis, and having a thickness dimension extending along a z-axis, said z-axis disposed generally normal to the x-axis and the y-axis, the waveforms having amplitudes extending generally along the z-axis; and
  (c) embedding the corrugated mesh sheet within a polymer gel layer, said gel layer having a gel layer outer margin extending along the x-axis and y-axis, at least a portion of the gel layer outer margin extending beyond the mesh outer margin, and extending beyond at least one of the first or second aircraft surfaces when the gasket is compressed, to define an edge portion tapered in an outwardly extended direction with a triangular profile at the end thereof, said edge portion having a durometer higher than the durometer of the remainder of the gel, whereby when the gasket is compressed between the first and the second aircraft surfaces, the corrugated mesh sheet provides electrical conductivity across the direction of the x-axis and the y-axis, and electrical contact and improved force deflection between the first and the second aircraft surfaces in the direction of the z-axis.

19. The method of claim 18 wherein the mesh is corrugated by crimping the mesh.

20. The method of claim 18 wherein the mesh sheet comprises one or more electrically-conductive fibers.

21. The method of claim 20 wherein the electrically-conductive fibers are non-conductive fibers having an electrically-conductive coating, metal wires, carbon fibers, graphite fibers, inherently-conductive polymer fibers, or a combination thereof.

22. The method of claim 21 wherein: the non-conductive fibers are cotton, wool, silk, cellulose, polyester, polyamide, nylon, polyimide, or a combination thereof, and the electrically-conductive coating is copper, nickel, silver, aluminum, tin, carbon, graphite, or an alloy or combination thereof and the metal wires are copper, nickel, silver, aluminum, bronze, steel, tin, or an alloy or combination thereof, or one or more of copper, nickel, silver, aluminum, bronze, steel, tin, or an alloy or combination thereof coated with one or more of copper, nickel, silver, aluminum, bronze, steel, tin, or an alloy or combination thereof.

23. The gasket of claim 18 wherein the peak portions of the corrugated mesh sheet are flattened at the top and extended outward along the z-axis.

24. The gasket of claim 18 wherein a fiberglass scrim sheet is molded with the mesh sheet to melt and fuse the fiberglass with the mesh sheet forming an integrated structure prior to embedding the mesh sheet in the elastomer gel.

25. The method of claim 18 wherein the x-axis defines a lengthwise dimension of the gasket, the y-axis defines a widthwise dimension of the gasket, and the z-axis defines a thickness dimension of the gasket, the thickness dimension of the gasket being small relative to the lengthwise and the widthwise dimension of the gasket.

* * * * *